(12) United States Patent
Farahani Samani et al.

(10) Patent No.: US 8,542,062 B2
(45) Date of Patent: Sep. 24, 2013

(54) ADAPTIVE DIGITAL PRE-DISTORTION METHOD AND DEVICE TO ENHANCE THE POWER UTILITY OF POWER AMPLIFIERS IN WIRELESS DIGITAL COMMUNICATION APPLICATIONS

(75) Inventors: Amirhooshang Farahani Samani, Lausanne (CH); Jeyran Hezaveh, Lausanne (CH); Ali Talebi, Dearborn Heights, MI (US)

(73) Assignee: Innovaradio SA, Plan-les-Ouates (CH)

( * ) Notice: Subject to any disclaimer, the term of this patent is extended or adjusted under 35 U.S.C. 154(b) by 0 days.

(21) Appl. No.: 13/509,893

(22) PCT Filed: Nov. 16, 2010

(86) PCT No.: PCT/EP2010/067611
§ 371 (c)(1),
(2), (4) Date: Jun. 5, 2012

(87) PCT Pub. No.: WO2011/058197
PCT Pub. Date: May 19, 2011

(65) Prior Publication Data
US 2012/0249233 A1   Oct. 4, 2012

Related U.S. Application Data

(60) Provisional application No. 61/281,241, filed on Nov. 16, 2009.

(51) Int. Cl.
*H03F 1/26* (2006.01)
(52) U.S. Cl.
USPC ............ 330/149; 330/291; 455/126; 375/296
(58) Field of Classification Search
USPC .................. 330/149, 291; 455/126; 375/296
See application file for complete search history.

(56) References Cited

U.S. PATENT DOCUMENTS

| | | | |
|---|---|---|---|
| 6,275,106 B1 | 8/2001 | Gomez | |
| 6,798,843 B1 | 9/2004 | Wright et al. | |

(Continued)

FOREIGN PATENT DOCUMENTS

| | | |
|---|---|---|
| EP | 1 463 198 | 9/2004 |
| GB | 2 359 432 | 8/2001 |

(Continued)

OTHER PUBLICATIONS

U.S. Appl. No. 13/002,006.
International Search Report issued in International Application No. PCT/IB2009/052888 mailed Oct. 12, 2009.

(Continued)

*Primary Examiner* — Patricia Nguyen
(74) *Attorney, Agent, or Firm* — DLA Piper LLP US

(57) ABSTRACT

The present invention concerns the field of power amplifiers and in particular the enhancement of the performance of the amplifier by a feedback loop acting on the input signal. It describes a method for linearizing a power amplifier circuit having a digital base-band input signal, a power output signal, a power amplifier and a linearizer module (LM), this method comprising the steps of: extracting a feedback signal from the power amplifier (PA) output signal, down-converting the feedback RF-signal to feedback IF-signal, filtering the feedback IF-signal with a band-pass filter, A/D converting the filtered feedback IF-signal into a feedback digital signal, converting the feedback digital signal into frequency-domain using fast-Fourier transform FFT on a block of n-samples to obtain a feedback FB-FFT block, converting the input base-band digital signal into frequency-domain using fast-Fourier transform FFT on a block of n-samples to obtain a input FF-FFT block, dividing the input FF-FFT block with the feedback FB-FFT block to obtain FFT correction samples blocks, averaging at least two blocks of FFT correction samples to obtain FFT correction coefficient values, applying the FFT correction coefficient values to a digital complex multiplier, converting the output of the multiplier from frequency domain into time domain with an inverse FFT module to obtain a corrected digital input signal, converting the corrected digital input signal to analog IF signal with a digital to analog converter to obtain a corrected IF input signal, applying the band-pass filter to the corrected IF input signal, up-converting the filtered corrected IF input signal to obtain a corrected RF input signal, applying the corrected RF input signal to the power amplifier.

11 Claims, 2 Drawing Sheets

(56) References Cited

U.S. PATENT DOCUMENTS

| | | |
|---|---|---|
| 7,035,345 B2 * | 4/2006 | Jeckeln et al. ............ 375/296 |
| 7,068,730 B2 | 6/2006 | Monta |
| 7,106,806 B1 | 9/2006 | Kenington |
| 2003/0184372 A1 | 10/2003 | Fudaba et al. |
| 2004/0021514 A1 | 2/2004 | Ring |
| 2004/0179629 A1 | 9/2004 | Song et al. |
| 2004/0189378 A1 | 9/2004 | Suzuki et al. |
| 2008/0068080 A1 | 3/2008 | Miyatani et al. |
| 2008/0187035 A1 | 8/2008 | Nakamura et al. |
| 2008/0197925 A1 | 8/2008 | Furuta et al. |

FOREIGN PATENT DOCUMENTS

| | | |
|---|---|---|
| WO | WO 01/05026 | 1/2001 |
| WO | WO 2007/046370 | 4/2007 |

OTHER PUBLICATIONS

Written Opinion issued in International Application No. PCT/IB2009/052888 mailed Oct. 12, 2009.

International Search Report issued in international Application No. PCT/EP2010/067611 mailed Feb. 2, 2011.

Written Opinion issued in International Application No. PCT/EP2010/067611 mailed Feb. 2, 2011.

* cited by examiner

ADAPTIVE DIGITAL PRE-DISTORTION METHOD AND DEVICE TO ENHANCE THE POWER UTILITY OF POWER AMPLIFIERS IN WIRELESS DIGITAL COMMUNICATION APPLICATIONS

INTRODUCTION

The present invention concerns the field of power amplifiers and in particular the enhancement of the performance of the amplifier by a feedback loop acting on the input signal. This invention can be used in each and every wireless communication transmitter, since there is definitely a power amplifier in the last part of the transmitter before the antenna, and every power amplifier has limited power performance (depending on type of modulation) due to its input-output curve. We are aiming to enhance the power utility of power amplifiers in different applications through introducing a new method of pre-distortion for mitigating linear and non-linear distortions of power amplifiers.

PRIOR ART

Nowadays, there are many different methods for linearization of power amplifiers which generally use look-up-tables (LUT) and/or use off-line methods for training the coefficients and LUTs once. Also, there are many adaptive methods which constantly adapt the coefficients and data used for linearization. Currently, majority of these adaptive methods are developed in time-domain and generally need training signals (such as pre- and post-ambles in the signal). Moreover, almost based on all current methods you cannot build a stand-alone, plug-and-play module which can be used in variety of current applications.

We are offering a novel method and system for linearization of PAs both in frequency domain and time domain, which can be implemented as a stand-alone plug-and-play module which is configurable, and is independent of many major parameters in wireless systems such as modulation, peak-to-average power ratio (PAPR) of the signal, and type of power amplifier (which is not the case in each and every other method presented so far).

Power amplifier circuits (output stages) are classified as A, B, AB and C for analog designs, and class D and E for switching designs based upon the conduction angle or 'angle of flow' Θ of the input signal through the amplifying device, that is, the portion of the input signal cycle during which the amplifying device conducts. The image of the conduction angle is derived from amplifying a sinusoidal signal. (If the device is always on, Θ=360°.) The angle of flow is closely related to the amplifier power efficiency. The various classes are introduced below.

Class A

100% of the input signal is used (conduction angle Θ=360° or 2π, i.e. the active element works in its linear range all of the time). Where efficiency is not a consideration, most small signal linear amplifiers are designed as Class A, which means that the output devices are always in the conduction region. Class A amplifiers are typically more linear and less complex than other types, but are very inefficient. This type of amplifier is most commonly used in small-signal stages or for low-power applications (such as driving headphones).

Class B

50% of the input signal is used (Θ=180° or it, i.e. the active element works in its linear range half of the time and is more or less turned off for the other half). In most Class B, there are two output devices (or sets of output devices), each of which conducts alternately for exactly 180 deg (or half cycle) of the input signal; selective RF amplifiers can also be implemented using a single active element.

These amplifiers are subject to crossover distortion if the handoff from one active element to the other is not perfect, as when two complimentary transistors (i.e. one PNP, one NPN) are connected as two emitter followers with their base and emitter terminals in common, requiring the base voltage to slew across the region where both devices are turned off.

Class AB

Here the two active elements conduct more than half of the time as a means to reduce the cross-over distortions of Class B amplifiers. In the example of the complementary emitter followers a bias network allows for more or less quiescent current thus providing an operating point somewhere between Class A and Class B. Sometimes a figure is added, e.g. AB1 or AB2, with higher figures implying a higher quiescent current and therefore more of the properties of Class A.

Class D

Main Article:

These use switching to achieve a very high power efficiency (more than 90% in modern designs). By allowing each output device to be either fully on or off, losses are minimized. The analog output is created by pulse width modulation (PWM), i.e. the active element is switched on for shorter or longer intervals instead of modifying its resistor. There are more complicated switching schemes like sigma-delta modulation, to improve some performance aspects like lower distortions or better efficiency.

Other Classes

There are several other amplifier classes, although they are mainly variations of the previous classes. For example, Class H and Class G amplifiers are marked by variation of the supply rails (in discrete steps or in a continuous fashion, respectively) following the input signal. Wasted heat on the output devices can be reduced as excess voltage is kept to a minimum. The amplifier that is fed with these rails itself can be of any class. These kinds of amplifiers are more complex, and are mainly used for specialized applications, such as very high-power units. Also, Class E and Class F amplifiers are commonly described in literature for radio frequencies applications where efficiency of the traditional classes deviate substantially from their ideal values. These classes use harmonic tuning of their output networks to achieve higher efficiency and can be considered a subset of Class C due to their conduction angle characteristics.

Each and every RF power amplifier distorts the input signal when the input signal power reaches close to saturation level of PA. These distortions can be modeled as AM/AM and AM/PM distortions which have described in a lot of literatures of communication. In some applications such as in OFDM systems, because of sensitivity of receivers to these types of distortions, the designers of total communication system use the PA in a sufficient margin from its saturation point to make sure that the output signal is not distorted more than acceptable threshold. Using different methods of pre-distortion, this margin can be reduced and the power utility of PA can be increased.

BRIEF DESCRIPTION OF THE INVENTION

The present invention concerns a method for linearizing a power amplifier circuit having a digital base-band input signal, a power output signal, a power amplifier and a linearizer module (LM), this method comprising the steps of:

extracting a feedback signal from the power amplifier (PA) output signal, down-converting the feedback RF-signal to feedback IF-signal, filtering the feedback IF-signal with a band-pass filter, A/D converting the filtered feedback IF-signal into a feedback digital signal, converting the feedback digital signal into frequency-domain using fast-Fourier transform FFT on a block of n-samples to obtain a feedback FB-FFT block, converting the input base-band digital signal into frequency-domain using fast-Fourier transform FFT on a block of n-samples to obtain a input FF-FFT block, dividing the input FF-FFT block with the feedback FB-FFT block to obtain FFT correction samples blocks, averaging at least two blocks of FFT correction samples to obtain FFT correction coefficient values, applying the FFT correction coefficient values to a digital complex multiplier, converting the output of the multiplier from frequency domain into time domain with an inverse FFT module to obtain a corrected digital input signal, Converting the corrected digital input signal to analog IF signal with a digital to analog converter to obtain a corrected IF input signal, applying the band-pass filter to the corrected IF input signal, up-converting the filtered corrected IF input signal to obtain a corrected RF input signal, applying the corrected RF input signal to the power amplifier.

It is to be noted that n can be any integer number greater than 128, and sample is applied to show a discrete-time signal in digital domain.

BRIEF DESCRIPTION OF THE DRAWINGS

The present invention and its advantages will be better understood thanks to the enclosed detailed description of a particular embodiment and to the enclosed drawings, in which.

DETAILED DESCRIPTION OF THE INVENTION

Figure 1:
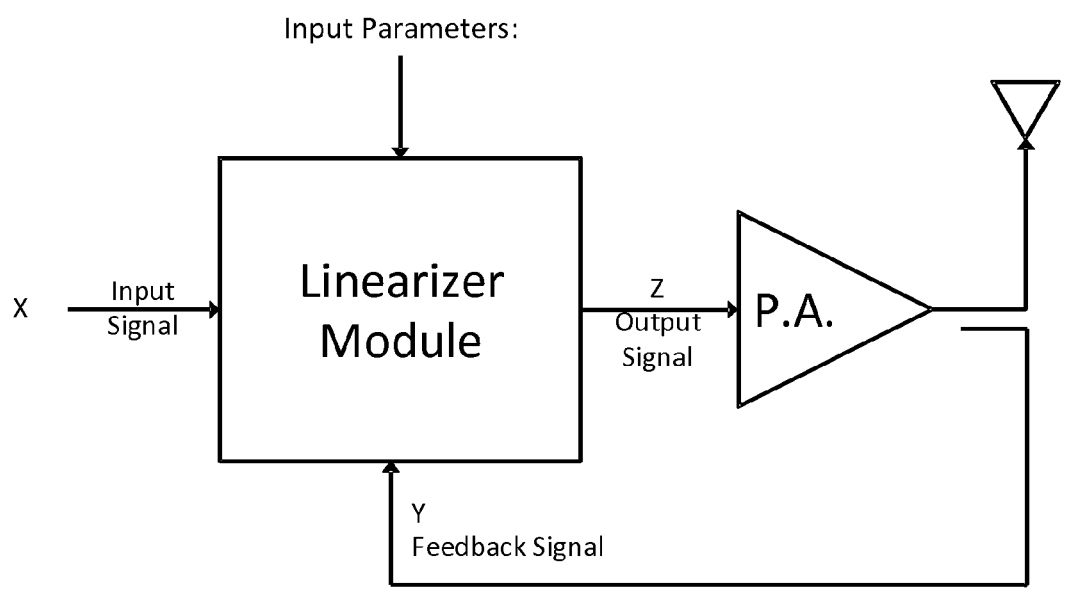
FIG. 1 illustrates the power amplifier circuit with its linearizer module.

A Linearizer Module (LM) within an embodiment of a Power Amplifier Circuit (FIG. 1) is presented. This Linearizer Module connected with the input signal X (which can be digital signal or Radio Frequency (RF) signal, and can come from a modulator or a transmitter or a power amplifier driver), the output signal Z (which is a RF signal and enters into the power amplifier) and the feedback signal Y (which is a RF sample signal coming from the output of power amplifier).

This linearizer module can be implemented as a stand-alone module or an integrated module within a modulator or a transmitter.

Figure 2:
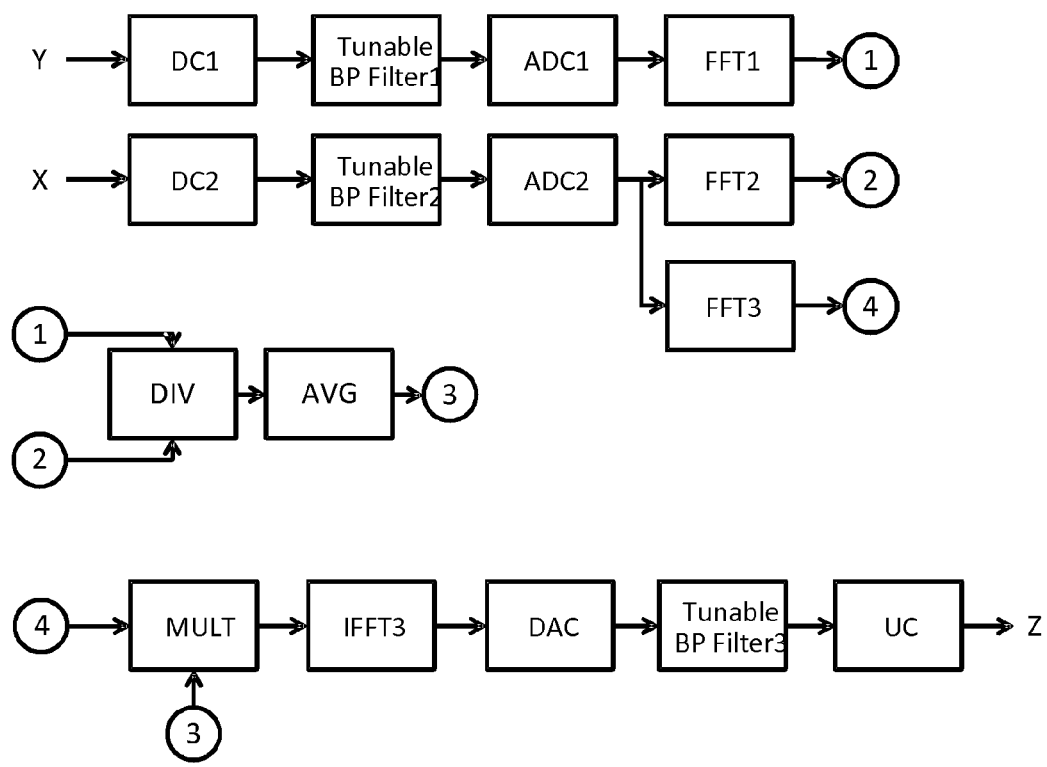
FIG. 2 illustrates a first embodiment of the linearizer module with RF input signal.

As depicted in FIG. 2, this linearizer module down-converts feedback RF signal Y (from power amplifier) into Intermediate Frequency (IF) band (module DC1 in FIG. 2), and after filtering IF signal through a band-pass filter (module Tunable BP Filter1 in FIG. 2), converts it into digital domain using an Analog-to-Digital (A/D) converter (module ADC1 in FIG. 2). The result is feedback digital signal. Then using a FFT1 (fast-Fourier transform) module converts the feedback digital signal into frequency-domain FB-FFT blocks.

As depicted in FIG. 2, this linearizer module converts input base-band RF signal X (from modulator) into Intermediate Frequency (IF) band (module DC2 in FIG. 2), and after filtering IF signal through a band-pass filter (module Tunable BP Filter2 in FIG. 2), converts it into digital domain using an Analog-to-Digital (A/D) converter (module ADC2 in FIG. 2). The result is feed-forward input digital signal. Then using a FFT2 module converts the feed-forward input digital signal into FF-FFT blocks. In the case the input to Linearizer Module is digital signal, the modules BP Filter2 and ADC2 are not needed.

Then, as depicted in FIG. 2, FB-FFT blocks and FF-FFT blocks enter into a division module (DIV), in which FF-FFT blocks divide by FB-FFT blocks. Then the result of division goes through averaging module (AVG), and after averaging on at least 2 blocks, the result is CORR-COEF-FFT coefficients block which are being used for correcting and compensating linear and non-linear distortions of Power Amplifier.

The feed-forward input digital signal is converted into FF-FFT blocks using FFT3 module; and then elements of each block are being multiplied by CORR-COEF-FFT coefficients (in a point-by-point array multiplication method) as depicted in FIG. 2, resulting in corrected digital signal CORR-SIG-FFT blocks. Now, the corrected digital signal (CORR-SIG-FFT blocks) passes through a windowing module in frequency domain for achieving required spectrum masks of signal. Then, the windowed blocks pass IFFT module, and are converted into time domain (CORR-SIG).

The corrected time-domain signal (CORR-SIG) is converted into analog using Digital-to-Analog converter (DAC module in FIG. 2). The output passes Tunable BP filter, and then is up-converted to RF signal Z using UC module, which is the output of Linearizer Module.

The invention claimed is:

1. A method for linearizing a power amplifier circuit having an input signal input, a power output signal output, a power amplifier and a linearizer module, the method comprising the steps of:

extracting a feedback signal from the power amplifier output signal;

down-converting the feedback radio frequency (RF) signal to a feedback intermediate frequency (IF) signal;

filtering the feedback IF signal with a band-pass filter;

analog/digital (AD) converting the filtered feedback IF signal into a feedback digital signal;

converting the feedback digital signal into a frequency-domain using a fast-Fourier transform (FFT) on a block of n-samples to obtain a feedback-FFT (FB-FFT) block;

converting the input base-band digital signal into a frequency-domain using an FFT on a block of n-samples to obtain an input feed forward-FFT (FF-FFT) block;

dividing the input FF-FFT blocks with the FB-FFT blocks to obtain FFT correction samples blocks;

averaging at least two blocks of FFT correction samples to obtain FFT correction coefficient values;

applying the FFT correction coefficient values to a digital complex multiplier;

converting an output of the multiplier from frequency domain into time domain with an inverse FFT module to obtain a corrected digital input signal;

converting the corrected digital input signal to analog IF signal with a digital to analog converter to obtain a corrected IF input signal;

applying the band-pass filter to the corrected IF input signal;

up-converting the filtered corrected IF input signal to obtain a corrected RF input signal; and applying the corrected RF input signal to the power amplifier.

2. The method of claim 1, in which the input signal of the power amplifier circuit is a RF input signal, further comprising the steps of:
  down-converting the RF input signal into IF input signal;
  filtering the IF input signal with a band-pass filter; and
  converting the filtered IF input signal into a digital input signal.

3. The method of claim 1, in which the band-pass filter is programmable according the input signal bandwidth.

4. A power amplifier circuit configured to input an input signal and output a power output signal, the power amplifier circuit comprising a power amplifier and a linearizer module connected to receive the input signal and a feedback radio frequency (RF) signal extracted from the power output signal, the linearizer module comprising:
  a down-converter configured to convert the feedback (RF) signal into a feedback intermediate frequency (IF) signal;
  a first band-pass filter configured to filter the feedback IF signal;
  a first analog/digital (A/D) converter configured to convert the filtered feedback IF signal into a feedback digital signal;
  a first fast-Fourier transform (FFT) module configured to convert the feedback digital signal into feedback-FFT (FB-FFT) blocks;
  a second FFT module configured to convert the input signal into input feed forward-FFT (FF-FFT) blocks;
  a division module configured to divide the input FF-FFT blocks by the FB-FFT blocks to obtain FFT correction blocks;
  an averaging module configured to average at least two blocks of FFT correction blocks to obtain averaged FFT coefficients correction values;
  a digital complex multiplier configured to receive the averaged FFT coefficients correction values, an input of said digital multiplier being the input FF-FFT blocks;
  an inverse FFT (IFFT) module configured to receive blocks from the digital complex multiplier and convert them into a time domain input digital signal;
  a digital/analog (D/A) converter configured to convert an output of the IFFT module into an analog form to obtain a corrected IF input signal;
  a second band-pass filter configured to input the corrected IF input signal and output a filtered corrected IF input signal; and
  an up-converter configured to convert the filtered corrected IF input signal in order to obtain a corrected RF input signal, and apply the corrected RF input signal to the power amplifier.

5. The system of claim 4, in which the input signal is an RF input signal, the linearizer module comprising:
  a second down-converter configured to convert the RF input signal into an IF input signal;
  a third band-pass filter configured to filter the IF input signal; and
  a second A/D converter configured to convert the filtered IF input signal into a digital signal.

6. The system of claim 4, in which the band-pass filters are digitally programmable for defining a bandwidth of said filters.

7. The system of claim 4 wherein the power amplifier is of a type selected among Solid State Power Amplifiers, Klystrons, Magnetrons, and Traveling Wave Tubes.

8. The Method of claim 2, in which the band-pass filter is programmable according the input signal bandwidth.

9. The system of claim 5, in which the band-pass filters are digitally programmable for defining a bandwidth of said filters.

10. The system of claim 5 wherein the power amplifier is of a type selected among Solid State Power Amplifiers, Klystrons, Magnetrons, and Traveling Wave Tubes.

11. The system of claim 6 wherein the power amplifier is of a type selected among Solid State Power Amplifiers, Klystrons, Magnetrons, and Traveling Wave Tubes.

* * * * *